(12) United States Patent
Freebern

(10) Patent No.: US 7,248,511 B2
(45) Date of Patent: Jul. 24, 2007

(54) RANDOM ACCESS MEMORY INCLUDING SELECTIVE ACTIVATION OF SELECT LINE

(75) Inventor: Margaret Freebern, Richmond, VT (US)

(73) Assignee: Infineon Technologies AG, Munich (DE)

( * ) Notice: Subject to any disclaimer, the term of this patent is extended or adjusted under 35 U.S.C. 154(b) by 95 days.

(21) Appl. No.: 11/065,196

(22) Filed: Feb. 24, 2005

(65) Prior Publication Data

US 2006/0187721 A1 Aug. 24, 2006

(51) Int. Cl.
*G11C 7/00* (2006.01)
(52) U.S. Cl. .................. 365/193; 365/230.06; 365/200
(58) Field of Classification Search ................ 365/193, 365/230.06, 200, 189.01
See application file for complete search history.

(56) References Cited

U.S. PATENT DOCUMENTS

| 5,305,278 | A | | 4/1994 | Inoue |
| 5,812,492 | A | * | 9/1998 | Yamauchi et al. ....... 365/233.5 |
| 5,822,264 | A | * | 10/1998 | Tomishima et al. ......... 365/222 |
| 6,065,143 | A | * | 5/2000 | Yamasaki et al. ........... 714/720 |
| 6,226,754 | B1 | | 5/2001 | Ware et al. |
| 6,226,757 | B1 | | 5/2001 | Ware et al. |
| 6,314,035 | B1 | | 11/2001 | Kitade et al. |
| 6,343,352 | B1 | | 1/2002 | Davis et al. |
| 2002/0046331 | A1 | | 4/2002 | Davis et al. |

* cited by examiner

*Primary Examiner*—Gene N. Auduong
(74) *Attorney, Agent, or Firm*—Dicke, Billig & Czaja, PLLC

(57) ABSTRACT

A random access memory that includes an array of memory cells, a first circuit configured to receive an address to address memory cells in the array of memory cells, and a second circuit. The second circuit is configured to obtain control signals including an address strobe signal and gate the address strobe signal using other control signals to provide a gated address strobe signal and to control activation of a select line signal based on the gated address strobe signal.

31 Claims, 4 Drawing Sheets

RANDOM ACCESS MEMORY INCLUDING SELECTIVE ACTIVATION OF SELECT LINE

BACKGROUND

Memory speed and memory capacity continue to increase to meet the demands of system applications. Some of these system applications include mobile electronic systems that have limited space and limited power resources. In mobile applications, such as cellular telephones and personal digital assistants (PDAs), memory cell density and power consumption are issues for future generations.

To address these issues, the industry is developing random access memories (RAMs) for mobile applications. One type of RAM, referred to as CellularRAM, is a high performance and low power memory designed to meet the growing memory density and bandwidth demands of future designs. CellularRAM is a pseudo static RAM (PSRAM) that offers a lower cost per bit ratio than current solutions. Also, CellularRAM offers static random access memory (SRAM) pin and function compatibility, external refresh-free operation, and a low power design. CellularRAM devices are drop-in replacements for most asynchronous low power SRAMs currently used in mobile applications, such as cellular telephones.

Typically, a PSRAM is based on a dynamic random access memory (DRAM) that provides significant advantages in density and speed over traditional SRAM. The DRAM can include one transistor and one capacitor memory cells that are arranged in one or more arrays of memory cells, which are arranged in memory banks. To read and write memory cells, each DRAM includes one or more row decoders, one or more column decoders, and sense amplifiers. The sense amplifiers can be differential sense amplifiers, wherein each sense amplifier receives one bit line at each of two differential inputs.

To read or write memory cells, the DRAM receives a row address, a column address, and control signals. A row decoder receives the row address to select a row of memory cells and a column decoder receives the column address to select one or more columns of memory cells. Each memory cell at the intersection of a selected row and a selected column provides a data bit to a sense amplifier.

At each sense amplifier that receives data, one of the bit lines receives the data bit from a selected memory cell and the other bit line is used as a reference. To read the data bit, the sense amplifier amplifies the difference between the data bit value and the reference value and provides a sensed output value to an output driver. To write a data bit into a selected memory cell, input drivers overdrive the sense amplifier. One input driver overdrives a data bit value onto the bit line that is connected to the selected memory cell and another input driver overdrives the inverse of the data bit value onto the reference bit line.

In some situations, a write command is issued to write selected memory cells, but some of the selected memory cells have been masked or columns of memory cells have been replaced with redundant columns of memory cells. Typically, to block the write command, a column connected to a masked or replaced memory cell is activated to access the memory cell as in normal writes and a high voltage level is driven onto each of the differential inputs of the connected sense amplifier. The sense amplifier does not detect a voltage difference in the data lines and therefore does not drive the bit lines, which prevents writing the accessed memory cell. However, transistors in the drivers may be mismatched. One driver may supply a higher voltage than the other driver causing the sense amplifier to be biased in one direction to leak charge away from a masked memory cell. Leaking charge away from a masked memory cell can cause data retention problems. Also, drivers and sense amplifiers use current when driven and, in mobile applications, power is a limited resource.

For these and other reasons there is a need for the present invention.

SUMMARY

One aspect of the present invention provides a random access memory that includes an array of memory cells, a first circuit configured to receive an address to address memory cells in the array of memory cells, and a second circuit. The second circuit is configured to obtain control signals including an address strobe signal and gate the address strobe signal using other control signals to provide a gated address strobe signal and to control activation of a select line signal based on the gated address strobe signal.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
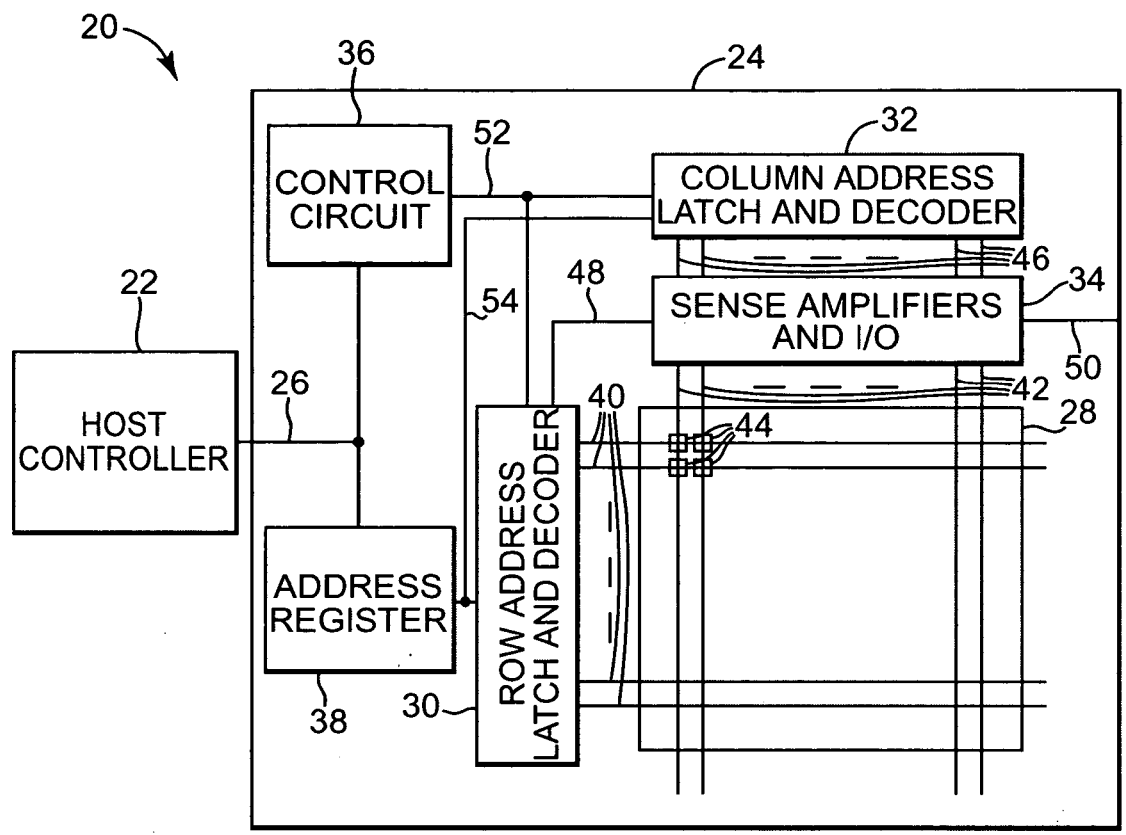
FIG. 1 is a block diagram illustrating one embodiment of an electronic system according to the present invention.

FIG. 1 is a block diagram illustrating one embodiment of an electronic system 20 according to the present invention. The electronic system 20 includes a host controller 22 and a random access memory (RAM) 24. The RAM 24 disables write commands by preventing activation of column select lines that are masked or replaced, instead of disabling write commands by providing high voltage levels to each of two differential inputs on a sense amplifier. This reduces current consumed by RAM 24 and prevents data retention problems.

Host controller 22 is electrically coupled to RAM 24 via memory communications path 26. Host controller 22 provides row and column addresses and control signals to RAM 24 via memory communications path 26. In one embodiment, RAM 24 is a dynamic random access memory (DRAM) and host controller 22 provides control signals including read/write enable, row address strobe (RAS), and column address strobe (CAS) signals. In one embodiment, RAM 24 is a pseudo static random access memory (PSRAM) and host controller 22 provides control signals including static RAM (SRAM) control signals.

RAM 24 includes an array of memory cells 28, a row address latch and decoder 30, a column address latch and decoder 32, sense amplifier and input/output (I/O) circuit 34, a control circuit 36, and an address register 38. Conductive word lines 40, referred to as row select lines, extend in the x-direction across the array of memory cells 28. Conductive bit lines 42, referred to as bit lines, extend in the y-direction across the array of memory cells 28. A memory cell 44 is located at each cross point of a word line 40 and a bit line 42.

Each word line 40 is electrically coupled to row address latch and decoder 30 and each bit line 42 is electrically coupled to one of the sense amplifiers in sense amplifier and I/O circuit 34. The sense amplifier and I/O circuit 34 is electrically coupled to column address latch and decoder 32 via conductive column select lines 46. Also, sense amplifier and I/O circuit 34 is electrically coupled to row address latch and decoder 30 via communication lines 48 and to data I/O pads or pins, referred to as DQs, via I/O communications path 50. Data is transferred between sense amplifier and I/O circuit 34 in RAM 24 and an external device, such as host controller 22, via I/O communications path 50.

Host controller 22 is electrically coupled to control circuit 36 and address register 38 via memory communications path 26. Control circuit 36 is electrically coupled to row address latch and decoder 30 and column address latch and decoder 32 via control communications path 52. Address register 38 is electrically coupled to row address latch and decoder 30 and column address latch and decoder 32 via row and column address lines 54.

Address register 38 receives row and column addresses from host controller 22 via memory communications path 26. Address register 38 supplies a row address to row address latch and decoder 30 via row and column address lines 54 and control circuit 36 supplies a RAS signal to row address latch and decoder 30 via control communications path 52 to latch the supplied row address into row address latch and decoder 30. Address register 38 supplies a column address to column address latch and decoder 32 via row and column address lines 54 and control circuit 36 supplies a CAS signal to column address latch and decoder 32 via control communications path 52 to latch the supplied column address into column address latch and decoder 32.

Sense amplifier and I/O circuit 34 includes sense amplifiers, equalization and precharge circuits, data input buffers, and data output buffers. The sense amplifiers are differential input sense amplifiers and each sense amplifier receives one bit line at each of the two differential inputs. One of the bit lines receives a data bit from a selected memory cell and the other bit line is used as a reference. The equalization and precharge circuits equalize the voltage on bit lines connected to the same sense amplifier prior to a read or write operation. To read a data bit, a sense amplifier amplifies the difference between the data bit value and the reference value and provides a sensed output value to one of the data output buffers. The data output buffer receives the sensed data bit value and supplies the data bit to one or more external devices, such as host controller 22, via I/O communications path 50. To write a data bit, a data input buffer receives and transfer the data bit from an external device to a sense amplifier in sense amplifier and I/O circuit 34 via I/O communications path 50. Data input buffer drivers overdrive the sense amplifier, wherein one input driver overdrives the data bit value onto the bit line that is connected to a selected memory cell and another input driver overdrives the inverse of the data bit value onto the reference bit line. The sense amplifier writes the received data bit value into the selected memory cell 44.

Row address latch and decoder 30 receives the row addresses and RAS signals and latches the row addresses into row address latch and decoder 30. Also, row address latch and decoder 30 decodes each of the row addresses to select a row of memory cells 44. In addition, row address latch and decoder 30 provides sense amplifier activation signals and equalization and precharge signals to sense amplifier and I/O circuit 34 via communications path 48.

Column address latch and decoder 32 activates column select lines 46 to connect sense amplifiers to I/O circuits in sense amplifier and I/O circuit 34. Column address latch and decoder 32 receives a column address and latches the column address into column address latch and decoder 32. Also, column address latch and decoder 32 decodes the column address to select addressed column select lines 46. In addition, column address latch and decoder 32 receives column select line activation signals from control circuit 36 via control communications path 52. The column select line activation signals indicate which of the addressed column select lines 46 are to be activated by column address latch and decoder 32. Column address latch and decoder 32 activates column select lines 46 that are addressed by the column address and selected for activation by the column select line activation signals. Activated column select lines 46 are provided to sense amplifier and I/O circuit 34 to connect sense amplifiers to I/O circuits.

Column select lines 46 are grouped into column segments. Each column segment includes a group of column select lines 46 that correspond to a set of I/O circuits. Multiple column select lines 46 in a column segment can share one I/O circuit in the set of I/O circuits, alternatively connecting a sense amplifier to the shared I/O circuit. Column select lines 46 in an adjacent column segment connect sense amplifiers to a different corresponding set of I/O circuits. When an addressed column select line is replaced with a spare column select line in the same or local column segment, activation of the replaced column select line is prevented via a disable for local redundancy signal. When an addressed column select line is replaced with a spare column select line in an adjacent column segment, activation of the replaced column select line is prevented via a disable for adjacent segment redundancy signal. Control circuit 36 controls activation of column select lines including deactivation of column select lines via the disable for local redundancy signals and the disable for adjacent segment redundancy signals.

Control circuit 36 receives addresses and control signals from host controller 22 via memory communications path 26. Also, control circuit 36 receives one or more data mask signals that indicate which memory cells are to be left unchanged during a write command. In one embodiment, RAM 24 is a DRAM and host controller 22 provides control signals including read/write enable, RAS, and CAS signals to control circuit 36. In one embodiment, RAM 24 is a PSRAM and host controller 22 provides control signals including SRAM control signals to control circuit 36 that provides the DRAM control signals, such as read/write enable, RAS, and CAS signals.

Control circuit 36 gates the received or provided CAS signal using the read/write enable signal and the data mask signal to provide a gated CAS signal. Gating the CAS signal blocks the CAS signal for masked column select lines. Blocking the CAS signal prevents activation of column select line enable signals, which prevents activation of column select line activation signals. Inactive column select line activation signals are transmitted from control circuit 36 to column address latch and decoder 32 and the masked column select lines are left inactive by column address latch and decoder 32.

Also, control circuit 36 evaluates redundancy for received column addresses. If a local redundancy hit is found and the addressed column select line is replaced with a local spare column select line, control circuit 36 provides the disable for local redundancy signal that prevents activation of the replaced column select line column select line activation signal. Inactive column select line activation signals are transmitted from control circuit 36 to column address latch and decoder 32 and the replaced column select line is left inactive by column address latch and decoder 32. If a redundancy hit is found and the addressed column select line is replaced with a spare column select line in an adjacent column segment, control circuit 36 provides the disable for adjacent segment redundancy signal that prevents activation of the replaced column select line column select line activation signal. Inactive column select line activation signals are transmitted from control circuit 36 to column address latch and decoder 32 and the replaced column select line is left inactive by column address latch and decoder 32. Thus, instead of disabling the write command by providing high voltage levels to each of two differential inputs on a sense amplifier, masked and replaced column select lines are left inactive by preventing activation of the column select line activation signal. This reduces current consumed by RAM 24 and prevents data retention problems.

During a read operation, control circuit 36 receives read control signals and address register 38 receives the row address of a selected memory cell or cells 44. The row address is supplied from address register 38 to row address latch and decoder 30 and latched into row address latch and decoder 30 by control circuit 36 and a RAS signal. Row address latch and decoder 24 decodes the row address and activates the selected word line 40. As the selected word line 40 is activated, the value stored in each memory cell 44 coupled to the selected word line 40 is passed to the respective bit line 42. The bit value stored at a memory cell 44 is detected by a sense amplifier that is electrically coupled to the respective bit line 42.

Next, control circuit 36 and address register 38 receive the column address of the selected memory cell or cells 44. The column address is supplied from address register 38 to column address latch and decoder 32 and latched into column address latch and decoder 32 by control circuit 36 and a CAS signal. The column address latch and decoder 32 decodes the column address to select column select lines 46. Control circuit 36 checks the column address for redundancy. If a redundancy hit is found, the replaced column select line is left inactive and the spare column select line and the other addressed column select lines are activated to connect selected sense amplifiers to I/O circuits that pass data to an external device via I/O communications path 50.

During a write operation, data to be stored in the array of memory cells 28 is supplied from an external device to the DQ's and data input buffers via I/O communications path 50. Control circuit 36 receives write control signals including data mask signals and address register 38 receives the row address of a selected memory cell or cells 44. The row address is supplied from address register 38 to row address latch and decoder 30 and latched into row address latch and decoder 30 by control circuit 36 and a RAS signal. The row address latch and decoder 30 decodes the row address and activates the selected word line 40. As the selected word line 40 is activated, the value stored in each memory cell 44 coupled to the selected word line 40 is passed to the respective bit line 42 and the sense amplifier that is electrically coupled to the respective bit line 42.

Next, control circuit 36 and address register 38 receive the column address of the selected memory cell or cells 44. Address register 38 supplies the column address to column address latch and decoder 32 and the column address is latched into column address latch and decoder 32 by control circuit 36 and a CAS signal. Control circuit 36 evaluates the column address for redundancy. If a redundancy hit occurs, control circuit 36 activates the disable for local redundancy signal or disable for adjacent segment redundancy signals to block activation of the replaced column select lines. Also, control circuit 36 gates the CAS signal based on the data mask signal to block activation of masked column select lines. Column address latch and decoder 32 receives column select line activation signals from control circuit 36 and activates selected column select lines to connect input buffers to sense amplifiers. The input buffers pass data from an external device to the sense amplifiers via I/O communications path 50. Also, the input buffers overdrive the sense amplifiers to write data to the selected memory cell or cells 44 via bit lines 42.

Figure 2:
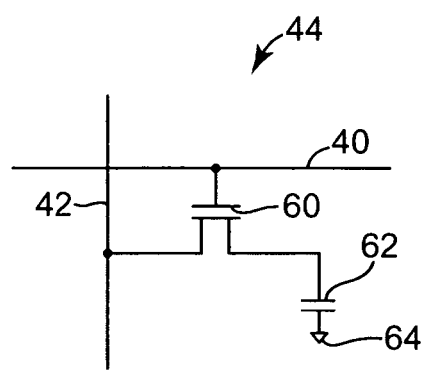
FIG. 2 is a diagram illustrating one embodiment of a memory cell in an array of memory cells.

FIG. 2 is a diagram illustrating one embodiment of a memory cell 44 in the array of memory cells 28. Memory cell 44 includes a transistor 60 and a capacitor 62. The gate of transistor 60 is electrically coupled to word line 40. One side of the drain-source path of transistor 60 is electrically coupled to bit line 42 and the other side of the drain-source path is electrically coupled to one side of capacitor 62. The other side of capacitor 62 is electrically coupled to a reference 64, such as one-half the supply voltage. Capacitor 62 is charged and discharged to represent a logic 0 or a logic 1.

During a read operation, word line 40 is activated to turn on transistor 60 and the value stored on capacitor 62 is read by a sense amplifier via bit line 42. During a write operation, word line 40 is activated to turn on transistor 60 and access capacitor 62. The sense amplifier connected to bit line 42 is overdriven to write a data value on capacitor 62 via bit line 42 and transistor 60.

A read operation on memory cell 44 is a destructive read operation. After each read operation, capacitor 62 is recharged or discharged to the data value that was just read. In addition, even without read operations, the charge on capacitor 62 discharges over time. To retain a stored value, memory cell 44 is refreshed periodically by reading and/or writing memory cell 44. All memory cells 44 in the array of memory cells 28 are periodically refreshed to maintain their values.

Figure 3:
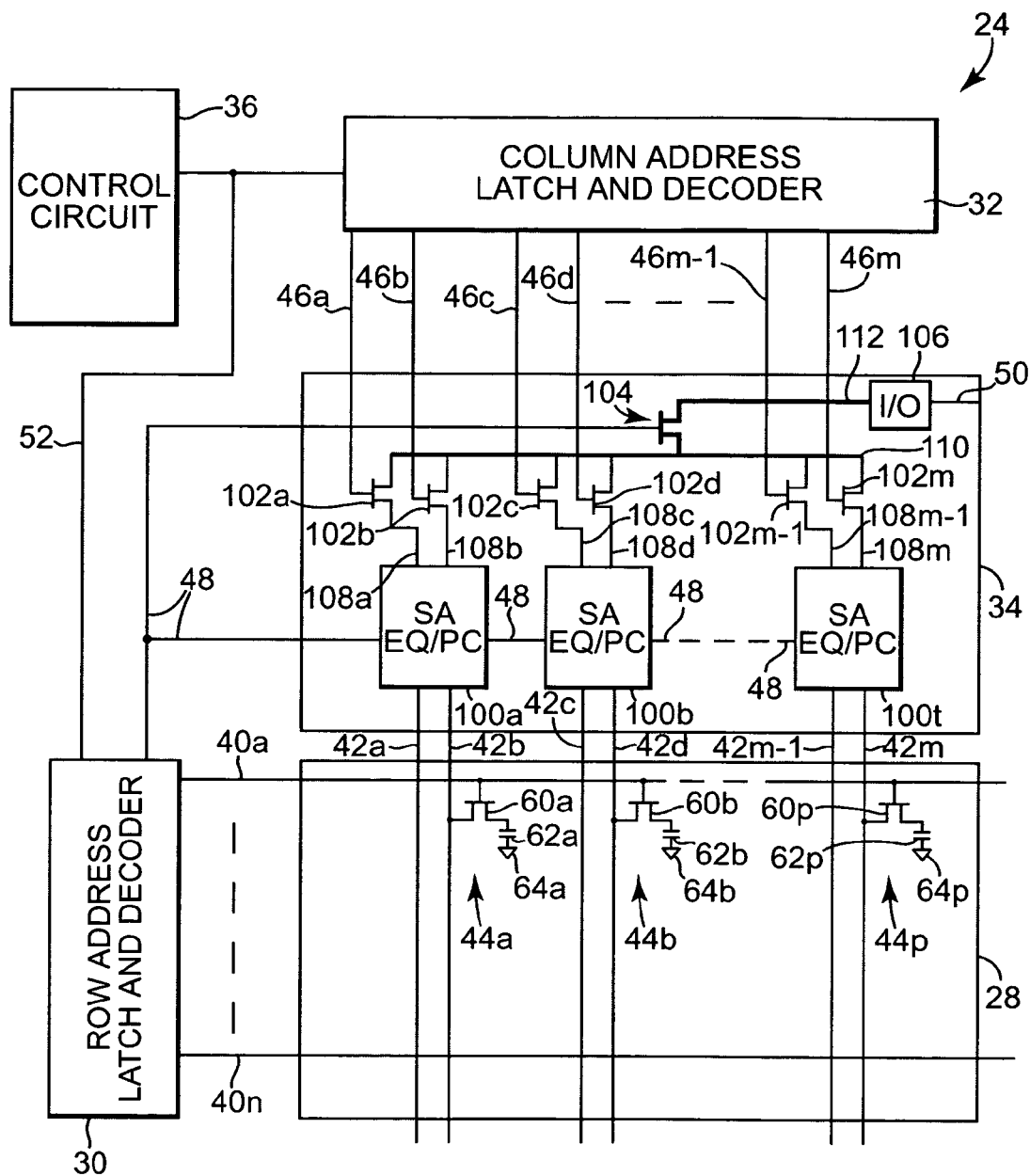
FIG. 3 is a diagram illustrating one embodiment of a random access memory according to the present invention.

FIG. 3 is a diagram illustrating one embodiment of RAM 24 according to the present invention. RAM 24 includes an array of memory cells 28, row address latch and decoder 30, column address latch and decoder 32, sense amplifier and I/O circuit 34, control circuit 36, and an address register (not shown). In one embodiment, RAM 24 is a DRAM that receives control signals including read/write enable, RAS, and CAS signals. In one embodiment, RAM 24 is a PSRAM that receives control signals including SRAM control signals.

Conductive word lines 40a–40n, referred to as row select lines, extend in the x-direction across the array of memory cells 28 and conductive bit lines 42a–42m extend in the y-direction across the array of memory cells 28. One of the memory cells 44a–44p is located at each cross point of a word line 40a–40n and a bit line 42a–42m. Memory cell 44a is located at the cross point of word line 40a and bit line 42b. Memory cell 44b is located at the cross point of word line 40a and bit line 42d, and memory cell 44p is located at the cross point of word line 40a and bit line 42m.

Each word line 40a–40n is electrically coupled to row address latch and decoder 30 and each bit line 42a–42m is electrically coupled to sense amplifier and I/O circuit 34. The sense amplifier and I/O circuit 34 is electrically coupled to column address latch and decoder 32 via conductive column select lines 46a–46m. Also, sense amplifier and I/O circuit 34 is electrically coupled to row address latch and decoder 30 via communication lines 48 and to data I/O pads or pins, referred to as DQs, via I/O communications path 50. Data is transferred between sense amplifier and I/O circuit 34 in RAM 24 and an external device via I/O communications path 50.

Control circuit 36 is electrically coupled to row address latch and decoder 30 and column address latch and decoder 32 via control communications path 52. The address register receives row and column addresses and supplies a row address to row address latch and decoder 30 and a column address to column address latch and decoder 32. Control circuit 36 supplies a RAS signal to row address latch and decoder 30 via control communications path 52 to latch the supplied row address into row address latch and decoder 30. Control circuit 36 supplies a CAS signal to column address latch and decoder 32 via control communications path 52 to latch the supplied column address into column address latch and decoder 32.

In the array of memory cells 28, each of the memory cells 44a–44p is similar to memory cell 44 of FIG. 2. Memory cell 44a includes a transistor 60a and a capacitor 62a. The gate of transistor 60a is electrically coupled to word line 40a. One side of the drain-source path of transistor 60a is electrically coupled to bit line 42b and the other side of the drain-source path is electrically coupled to one side of capacitor 62a. The other side of capacitor 62a is electrically coupled to a reference 64a, such as one-half the supply voltage. Memory cell 44b includes a transistor 60b and a capacitor 62b. The gate of transistor 60b is electrically coupled to word line 40a. One side of the drain-source path of transistor 60b is electrically coupled to bit line 42d and the other side of the drain-source path is electrically coupled to one side of capacitor 62b. The other side of capacitor 62b is electrically coupled to a reference 64b, such as one-half the supply voltage. Each of the other memory cells 44 in the array of memory cells 28 is similar to memory cell 44a and memory cell 44b including memory cell 44p that includes a transistor 60p and a capacitor 62p. The gate of transistor 60p is electrically coupled to word line 40a. One side of the drain-source path of transistor 60p is electrically coupled to bit line 42m and the other side of the drain-source path is electrically coupled to one side of capacitor 62p. The other side of capacitor 62p is electrically coupled to a reference 64p, such as one-half the supply voltage. The other memory cells 44 in the array of memory cells 28 are not shown for clarity.

Sense amplifier and I/O circuit 34 includes sense amplifiers 100a–100t, column select line transistors 102a–102m, output enable transistors 104, and an I/O circuit 106. Sense amplifiers 100a–100t include equalization and precharge circuits and I/O circuit 106 includes data input buffers and data output buffers. Each of the sense amplifiers 100a–100t is electrically coupled to row address latch and decoder 30 via communications path 48.

Sense amplifiers 100a–100t are electrically coupled to bit lines 42a–42m and to column select line transistors 102a–102m. Each of the sense amplifiers 100a–100t is electrically coupled to two of the bit lines 42a–42m. Sense amplifier 100a is electrically coupled to bit line 42a and bit line 42b. Sense amplifier 100b is electrically coupled to bit line 42c and bit line 42d, and so on, up to sense amplifier 100t that is electrically coupled to bit line 42m-1 and bit line 42m. Also, each of the sense amplifiers is electrically coupled to the drain-source paths of two of the column select line transistors 102a–102m. Sense amplifier 100a is electrically coupled to the drain-source path of column select line transistor 102a at 108a and the drain-source path of column select line transistor 102b at 108b. Sense amplifier 100b is electrically coupled to the drain-source path of column select line transistor 102c at 108c and the drain-source path of column select line transistor 102d at 108d, and so on, up to sense amplifier 100t that is electrically coupled to the drain-source path of column select line transistor 102m-1 at 108m-1 and the drain-source path of column select line transistor 102m at 108m. The other sides of the drain-source paths of column select line transistors 102a–102m are electrically coupled to local data bus 110.

Sense amplifiers 100a–100t are differential sense amplifiers. Each of the sense amplifiers 100a–100t receives one of the coupled bit lines 42a–42m at each of two differential inputs and provides differential output signals, including an output signal and the inverse of the output signal, to column select line transistors 102a–102m. Sense amplifier 100a receives bit line 42a at one differential input and bit line 42b at the other differential input. Sense amplifier 100b receives bit line 42c at one differential input and bit line 42d at the other differential input, and so on, up to sense amplifier 100t that receives bit line 42m-1 at one differential input and bit line 42m at the other differential input. Sense amplifier 100a provides one sensed output signal to column select line transistor 102a and the inverse of the sensed output signal to column select line transistor 102b. Sense amplifier 100b provides one sensed output signal to column select line transistor 102c and the inverse of the sensed output signal to column select line transistor 102d, and so on, up to sense amplifier 100t that provides one sensed output signal to column select line transistor 102m-1 and the inverse of the sensed output signal to column select line transistor 102m.

The gate of each of the column select line transistors 102a–102m is electrically coupled to one of the column select lines 46a–46m. The gate of column select line transistor 102a is electrically coupled to column select line 46a. The gate of column select line transistor 102b is electrically coupled to column select line 46b. The gate of column select line transistor 102c is electrically coupled to column select line 46c. The gate of column select line transistor 102d is electrically coupled to column select line 46d and so on, up to the gate of column select line transistor 102m-1 is electrically coupled to column select line 46m-1 and the gate of column select line transistor 102m being electrically coupled to column select line 46m.

Local data bus 110 is electrically coupled to one side of the drain-source paths of output enable transistors 104. The other sides of the drain-source paths of the output enable transistors 104 are electrically coupled to global data bus 112 that is electrically coupled to I/O circuit 106. Each line in the global data bus 112 is electrically coupled to a data input buffer and a data output buffer in I/O circuit 106. The gates of the output enable transistors 104 are electrically coupled to row address latch and decoder 30 via communications path 48.

Row address latch and decoder 30 receives row addresses and RAS signals to latch the received row addresses into row address latch and decoder 30. Row address latch and decoder 30 decodes a row address to select one of the word lines 40a–40n. The selected word line 40a–40n is used to select and turn on transistors 60a–60p that have gates coupled to the selected word line 40a–40n. Data bit values from capacitors 62a–62p coupled to the selected transistors 60a–60p are passed to sense amplifiers 100a–100t via the selected transistors 60a–60p and coupled bit lines 42a–42m. Also, row address latch and decoder 30 provides sense amplifier activation signals and equalization and precharge signals to sense amplifiers 100a–100t via communications path 48. In addition, row address latch and decoder 30 provides output enable signals to output enable transistors 104 via communications path 48. The output enable signals turn on output enable transistors 104 to connect lines in local data bus 110 to lines in global data bus 112.

Column address latch and decoder 32 activates column select lines 46a–46m to turn on selected column select line transistors 102a–102m and connect selected sense amplifiers 100a–100t to lines in local data bus 110. Column address latch and decoder 32 receives a column address to latch the column address into column address latch and decoder 32. Column address latch and decoder 32 decodes the column address to select one or more column select lines 46a–46m. In one embodiment, column address latch and decoder 32 selects four column select lines 46a–46m based on one column address.

Column address latch and decoder 32 receives column select line activation signals from control circuit 36 via control communications path 52. The column select line activation signals indicate which of the selected column select lines 46a–46m are to be activated by column address latch and decoder 32. Column address latch and decoder 32 activates column select lines 46a–46m that are selected by the column address and selected for activation by the column select line activation signals.

Activated column select lines 46a–46m are provided to the gates of column select line transistors 102a–102m coupled to the activated column select lines 46a–46m. The activated column select lines 46a–46m turn on the coupled column select line transistors 102a–102m to connect selected sense amplifiers 100a–100t to lines in local data bus 110. In one embodiment, column address latch and decoder 32 activates both of the column select line transistors 102a–102m coupled to a selected sense amplifier 100a–100t to communicate data and the inverse of the data between the selected sense amplifier 100a–100t and I/O circuit 106.

Column select lines 46a–46m are grouped into column segments. Each column segment includes a group of column select lines 46a–46m that use one set of input buffers and output buffers in I/O circuit 106. Multiple column select lines 46a–46m in a column segment can share one input/output buffer pair in the set of input buffers and output buffers, alternatively connecting one of the sense amplifiers 100a–100t to the input/output buffer pair in I/O circuit 106. Column select lines 46a–46m in adjacent column segments use a different set of input buffers and output buffers in I/O circuit 106. If one of the addressed column select lines 46a–46m is replaced with a spare one of the column select lines 46a–46m that is in the local column segment, activation of the replaced column select line 46a–46m is prevented via a disable for local redundancy signal. If one of the addressed column select lines 46a–46m is replaced with a spare one of the column select lines 46a–46m in an adjacent column segment, activation of the replaced column select line 46a–46m is prevented via a disable for adjacent segment redundancy signal. Control circuit 36 controls activation of column select lines 46a–46m, including deactivation of column select lines 46a–46m via disable for local redundancy signals and disable for adjacent segment redundancy signals.

Control circuit 36 receives row and column addresses, control signals, and data mask signals to control operation of RAM 24. The data mask signals indicate whether some of the memory cells 44a–44p are left unchanged during a write command. In one embodiment, one data mask signal masks the upper byte of a sixteen bit write command and another data mask signal masks the lower byte of a sixteen bit write command. In one embodiment, RAM 24 is a DRAM and the control signals include read/write enable, RAS, and CAS signals. In one embodiment, RAM 24 is a PSRAM and the control signals include SRAM control signals used by control circuit 36 to provide DRAM control signals, such as read/write enable, RAS, and CAS signals.

Control circuit 36 regulates the received or provided CAS signal using the read/write enable signal and data mask signals to provide a regulated CAS signal. The CAS signal is gated using the read/write enable signal and the data mask signals. If one or more of the data mask signals are active and the read/write signal indicates a write command, the CAS signal pulse is blocked to prevent activation of selected column select line enable signals. Preventing activation of selected column select line enable signals prevents activation of selected column select line activation signals. Control circuit 36 provides the inactive column select line activation signals for masked column select lines 46a–46m to column address latch and decoder 32 and the masked column select lines 46a–46m are left inactive by column address latch and decoder 32.

Control circuit 36 evaluates redundancy for received column addresses. If a local redundancy hit is found and one of the addressed column select lines 46a–46m is replaced with a local spare column select line 46a–46m, control circuit 36 provides the disable for local redundancy signal and prevents activation of the replaced column select line activation signal. Control circuit 36 provides the inactive column select line activation signal for the replaced column select line 46a–46m to column address latch and decoder 32 and the replaced column select line 46a–46m is left inactive by column address latch and decoder 32. If a redundancy hit is found and one of the addressed column select lines 46a–46m is replaced with a spare column select line 46a–46m in an adjacent column segment, control circuit 36 provides the disable for adjacent segment redundancy signal and prevents activation of the replaced column select line activation signal. Control circuit 36 provides the inactive column select line activation signal for the replaced column select line 46a–46m to column address latch and decoder 32 and the replaced column select line 46a–46m is left inactive by column address latch and decoder 32.

Thus, instead of preventing a write command to selected memory cells 44a–44p by providing high voltage levels to each of the two inputs on one of the sense amplifiers 100a–100t, masked and replaced column select lines 46a–46m are left inactive by preventing activation of column select line activation signals. Leaving the selected column select lines 46a–46m inactive turns off selected column select line transistors 102a–102m, which blocks write data from I/O circuit 106 from passing to sense amplifiers 100a–100t. This prevents the write command from writing selected memory cells 44a–44p via the sense amplifiers 100a–100t.

During a read operation, control circuit 36 receives read control signals and row address latch and decoder 30 receives a row address that is latched into row address latch and decoder 30 via control circuit 36 and a RAS signal. Row address latch and decoder 30 provides sense amplifier activation and equalization and precharge signals to sense amplifiers 100a–100t and output enable signals to output enable transistors 104. The output enable signals turn on output enable transistors 104 to connect local data bus 110 to global data bus 112. Sense amplifiers 100a–100t include equalization and precharge circuits that equalize the voltages on pairs of bit lines 42a–42m in response to the sense amplifier activation and equalization and precharge signals. For example, sense amplifier 100a includes equalization and precharge circuits that equalize the voltage on bit lines 42a and 42b.

Row address latch and decoder 30 decodes the row address and activates a selected word line, such as word line 40a. As selected word line 40a is activated, the value stored in each memory cell 44a–44p coupled to selected word line 40a is passed to the respective bit line 42a–42m. The bit value stored at a memory cell, such as memory cell 44a, is passed to a sense amplifier, such as sense amplifier 100a, via a bit line, such as bit line 42b.

To read the data bit value from memory cell 44a, sense amplifier 100a receives the data bit value from memory cell 44a via bit line 42b and uses the voltage value on bit line 42a as a reference. Sense amplifier 100a amplifies the difference between the data bit value on bit line 42b and the reference value on bit line 42a and provides a sensed output value to column select line transistor 100b and the inverse of the sensed output value to column select line transistor 100a.

Next, control circuit 36 and column address latch and decoder 32 receive the column address of the selected memory cell or cells 44a–44p and latch the column address into column address latch and decoder 32 via control circuit 36 and a CAS signal. The column address latch and decoder 32 decodes the column address to select column select lines 46a–46m. Control circuit 36 evaluates the column address for redundancy.

If a local redundancy hit is found, control circuit 36 provides the disable for local redundancy signal and prevents activation of the replaced column select line activation signal. Control circuit 36 provides the inactive column select line activation signal to column address latch and decoder 32. If a redundancy hit is found and one of the addressed column select lines 46a–46m is replaced with a spare column select line 46a–46m in an adjacent column segment, control circuit 36 provides the disable for adjacent segment redundancy signal and prevents activation of the replaced column select line activation signal. Control circuit 36 provides inactive column select line activation signals for replaced column select lines 46a–46m to column address latch and decoder 32. Replaced column select lines 46a–46m are left inactive via column address latch and decoder 32. Spare column select lines 46a–46m and other selected column select lines 46a–46m are activated via column address latch and decoder 32 to connect selected sense amplifiers 100a–100t to local data bus 110.

To read sense amplifier 100a, column select lines 46a and 46b are activated to turn on column select line transistors 102a and 102b that pass the sensed output value and the inverse of the sensed output value to local data bus 110. Row address latch and decoder 30 provides the active output enable signals to output enable transistors 104 via communication lines 48 and output enable transistors 104 pass the sensed output value and the inverse of the sensed output value to global data bus 112 and data output buffers in I/O circuit 106. The data output buffers receive the sensed output value and the inverse of the sensed output value and supply the data to one or more external devices via I/O communications path 50.

During a write operation, data to be stored in the array of memory cells 28 is supplied from an external device to data input buffers in I/O circuit 106 via I/O communications path 50. Control circuit 36 receives a row address, write control signals and data mask signals. Row address latch and decoder 30 receives the row address that is latched into row address latch and decoder 30 via control circuit 36 and a RAS signal.

Row address latch and decoder 30 provides sense amplifier activation and equalization and precharge signals to sense amplifiers 100a–100t and output enable signals to output enable transistors 104. The output enable signals turn on output enable transistors 104 to connect global data bus 112 to local data bus 110. Sense amplifiers 100a–100t include equalization and precharge circuits that equalize the voltages on pairs of bit lines 42a–42m in response to the sense amplifier activation and equalization and precharge signals. For example, sense amplifier 100a includes equalization and precharge circuits that equalize the voltage on bit lines 42a and 42b.

Row address latch and decoder 30 decodes the row address and activates a selected word line, such as word line 40a. As selected word line 40a is activated, the value stored in each memory cell 44a–44p coupled to selected word line 40a is passed to the respective bit line 42a–42m. The bit value stored at a memory cell, such as memory cell 44a, is passed to a sense amplifier, such as sense amplifier 100a, via a bit line, such as bit line 42b.

Next, control circuit 36 and column address latch and decoder 32 receive the column address of the selected memory cell or cells 44a–44p and latch the column address into column address latch and decoder 32 via control circuit 36 and a CAS signal. The column address latch and decoder 32 decodes the column address to select column select lines 46a–46m. Control circuit 36 regulates the CAS signal and evaluates the column address for redundancy.

Control circuit 36 regulates the received or provided CAS signal using the read/write enable signal and data mask signals to provide a regulated CAS signal. The CAS signal is gated using the read/write enable signal and the data mask signals. If one or more of the data mask signals are active and the read/write signal indicates a write command, the CAS signal pulse is blocked to prevent activation of selected column select line enable signals. Preventing activation of selected column select line enable signals prevents activation of selected column select line activation signals. Control circuit 36 provides the inactive column select line activation signals for masked column select lines 46a–46m to column address latch and decoder 32.

If a local redundancy hit is found, control circuit 36 provides the disable for local redundancy signal and prevents activation of the replaced column select line activation signal. Control circuit 36 provides the inactive column select line activation signal to column address latch and decoder 32. If a redundancy hit is found and one of the addressed column select lines 46a–46m is replaced with a spare column select line 46a–46m in an adjacent column segment, control circuit 36 provides the disable for adjacent segment redundancy signal and prevents activation of the replaced column select line activation signal. Control circuit 36 provides inactive column select line activation signals for replaced column select lines 46a–46m to column address latch and decoder 32.

Column address latch and decoder 32 receives column select line activation signals from control circuit 36 and activates selected column select lines 46a–46m to connect sense amplifiers 100a–100t to local data bus 104. Masked and replaced column select lines 46a–46m are left inactive via column address latch and decoder 32. Input buffers in I/O circuit 106 drive data received from an external device to the sense amplifiers 100a–100t via global data bus 112, output enable transistors 104, local data bus 110, and column select transistors 102a–102m. The input buffers overdrive the sense amplifiers 100a–100t to write data into selected memory cell or cells 44a–44b via bit lines 42a–42m.

To write a data bit value into memory cell 44a, data input buffers in I/O circuit 106 receive a data bit value and the inverse of the data bit value via communications path 50. The data input buffers transmit the data bit value and the inverse of the data bit value to output enable transistors 104 via global data bus 112. Row address latch and decoder 30 provides active output enable signals to turn on output enable transistors 104 via communication lines 48 and output enable transistors 104 pass the data bit value and the inverse of the data bit value to local data bus 110. Column select lines 46a and 46b are activated to turn on column select line transistors 102a and 102b that pass the data bit value and the inverse of the data bit value to sense amplifier 100a. The data input buffers overdrive sense amplifier 100a, wherein one input driver overdrives the data bit value onto bit line 42b and into selected memory cell 44a and another data input buffer overdrives the inverse of the data bit value onto the reference bit line 42a. Sense amplifier 100a writes the data bit value into memory cell 44a and word line 40a is deselected to turn off transistor 60a in memory cell 44a.

Figure 4:
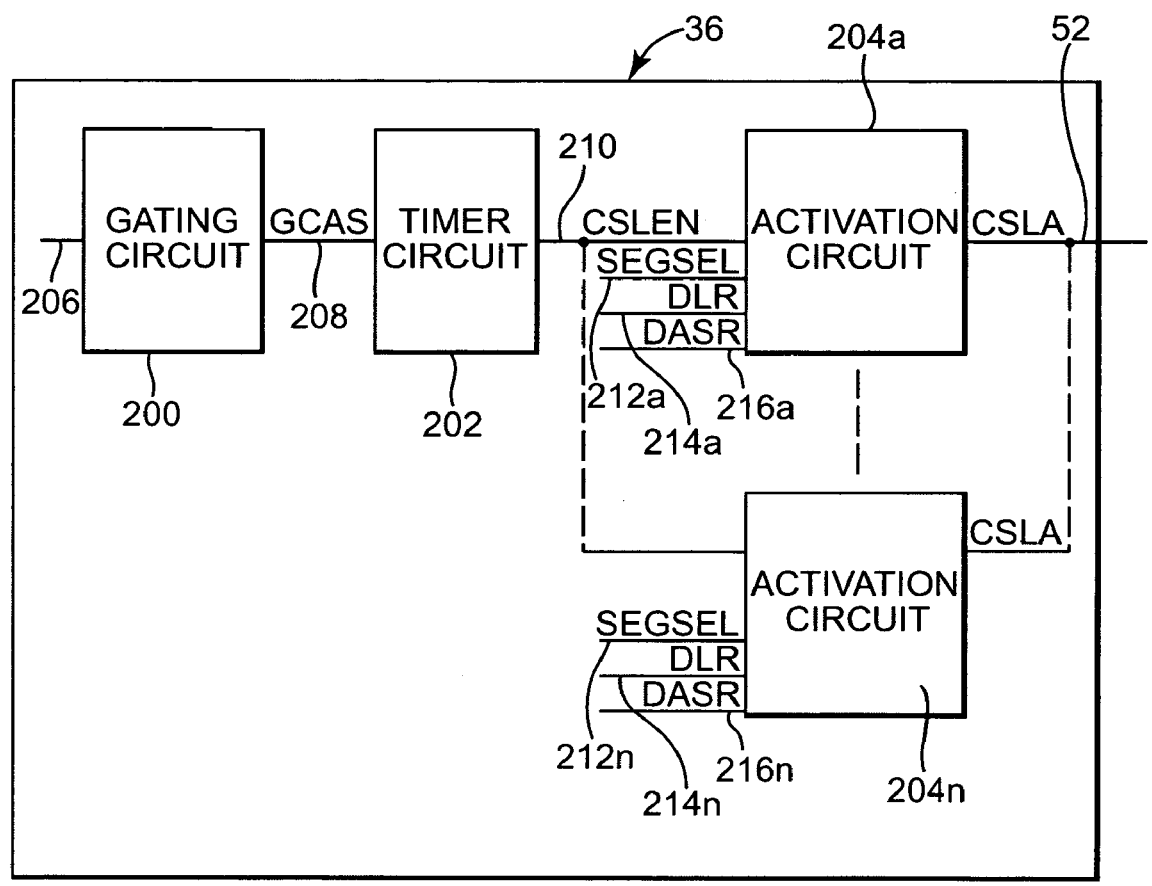
FIG. 4 is a diagram illustrating one embodiment of a control circuit.

FIG. 4 is a diagram illustrating one embodiment of control circuit 36. Control circuit 36 includes a gating circuit 200, a timer circuit 202, and activation circuits 204a–204n. Gating circuit 200 is electrically coupled to receive control signals from control circuit 36 and external circuitry via gating communications path 206 and to timer circuit 202 via timer communications path 208. Timer circuit 202 is electrically coupled to activation circuits 204a–204n via activation circuit communications path 210 and activation circuits 204a–204n are electrically coupled to a column address latch and decoder via control communications path 52. Each of the activation circuits 204a–204n provides a column select line activation signal CSLA to the column address latch and decoder circuit via control communications path 52 to activate or prevent activation of column select lines. In one embodiment, control circuit 36 includes multiple gating circuits and multiple timer circuits and each of the multiple timer circuits is coupled to multiple activation circuits. In other embodiments, control circuit 36 includes any suitable number of gating circuits, timer circuits and activation circuits.

Gating circuit 200 receives control signals during a read command and a write command via gating communications path 206. The control signals can be received from external circuitry and/or provided by control circuit 36. The control signals include a CAS signal CAS, a data mask signal bDM, and a write signal bWR. CAS signal CAS includes a pulse that pulses from a low voltage level to a high voltage level and back to a low voltage level during a read command and during a write command. The write signal bWR is an active low signal that is at a high voltage level during a read command and a low voltage level during a write command. The data mask signal bDM is an active low signal. If data mask signal bDM is high, then memory cells are not masked and the memory cells can be written with data. If data mask signal bDM is low, memory cells are masked and the memory cells cannot be written with data.

Gating circuit 200 includes logic that gates the pulse in CAS signal CAS to provide a gated CAS signal GCAS. If write signal bWR is at a high voltage level, indicating a read command, gating circuit 200 provides the pulse in CAS signal CAS as a pulse in the gated CAS signal GCAS to timer circuit 202. Also, if data mask signal bDM is at a high voltage level, indicating that memory cells are not masked and can be written, gating circuit 200 provides the pulse in CAS signal CAS as a pulse in the gated CAS signal GCAS to timer circuit 202. If write signal bWR and data mask signal bDM are at low voltage levels, gating circuit 200 blocks the pulse in CAS signal CAS and provides a low voltage level gated CAS signal GCAS to timer circuit 202.

Timer circuit 202 receives the gated CAS signal GCAS and provides a column select line enable signal CSLEN to activation circuits 204a–204n. If the gated CAS signal GCAS includes a pulse, timer circuit 202 provides a pulse in the column select line enable signal CSLEN. The pulse is a timed signal that pulses from a low voltage level to a high voltage level and back to a low voltage level. Timer circuit 202 provides a low voltage level column select line enable signal CSLEN if the gated CAS signal GCAS does not include a pulse. Timer circuit 202 provides the column select line enable signal CSLEN to activation circuits 204a–204n.

Activation circuits 204a–204n receive the column select line enable signal CSLEN from timer circuit 202 via activation circuit communications path 210. Also, activation circuits 204a–204n receive activation control signals via control circuit 36. Activation control signals received via control circuit 36 include segment select signals SEGSEL at 212a–212n, disable for local redundancy signals DLR at 214a–214n, and disable for adjacent segment redundancy signals DASR at 216a–216n. Each of the activation circuits 204a–204n provides a column select line activation signal CSLA for one of the column select lines 46a–46m (shown in FIG. 3). Activation control signals received by one of the activation circuits 204a–204n pertain to the corresponding one of the column select lines 46a–46m.

Segment select signals SEGSEL at 212a–212n are the product of address decoding. Each of the segment select signals at 212a–212n indicates whether a column segment is addressed. If a column segment is addressed, the segment select signals SEGSEL for that column segment are set to high voltage levels. If a column segment is not addressed the segment select signals SEGSEL for that column segment are set to low voltage levels. Multiple activation circuits 204a–204n may receive segment select signals SEGSEL for the same column segment.

Each of the disable for local redundancy signals DLR at 214a–214n indicates whether a column select line is replaced with a spare column select line in the local column segment. The replaced column select line is suppressed. If a column select line is replaced, the disable for local redundancy signal DLR at 214a–214n is a high voltage level. If a column select line is not replaced, the disable for local redundancy signal DLR at 214a–214n is a low voltage level.

Each of the disable for adjacent segment redundancy signals DASR at 216a–216n indicates whether a column select line is replaced with a spare column select line in an adjacent column segment. The replaced column select line is suppressed. If a column select line is replaced, the disable for adjacent segment redundancy signals DASR at 216a–216n is a high voltage level. If a column select line is not replaced, the disable for adjacent segment redundancy signals DASR at 216a–216n is a low voltage level.

Activation circuit 204a receives the column select line enable signal CSLEN from timer circuit 202 and the activation control signals, including segment select signal SEGSEL at 212a, disable for local redundancy signal DLR at 214a, and disable for adjacent segment redundancy signal DASR at 216a. If segment select signal SEGSEL at 212a is a high voltage level and disable for local redundancy signal DLR at 214a is a low voltage level and disable for adjacent segment redundancy signal DASR at 216a is a low voltage level, activation circuit 204a provides a column select line activation signal CSLA based on the column select line enable signal CSLEN. If the column select line enable signal CSLEN includes a pulse, activation circuit 204a provides a pulse in the column select line activation signal CSLA. If the column select line enable signal CSLEN remains at a low voltage level, activation circuit 204a provides a low voltage level column select line activation signal CSLA that inhibits activation of the corresponding one of the column select lines 46a–46m.

If segment select signal SEGSEL at 212a is a low voltage level or disable for local redundancy signal DLR at 214a is a high voltage level or disable for adjacent segment redundancy signal DASR at 216a is a high voltage level, activation circuit 204a provides a low voltage level column select line activation signal CSLA that inhibits activation of the corresponding one of the column select lines 46a–46m. Each of the activation circuits 204a–204n are similar to activation circuit 204a.

Figure 5:
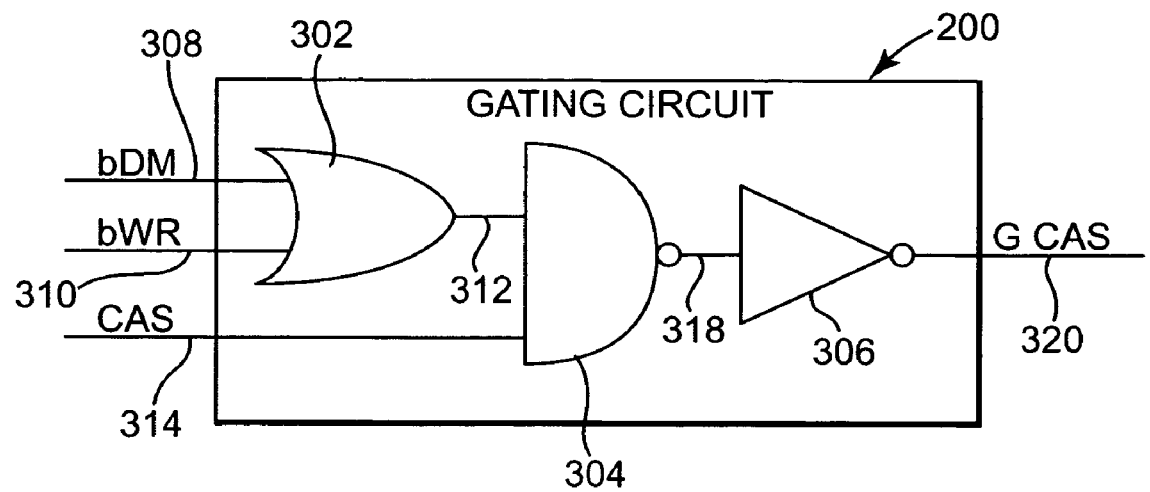
FIG. 5 is a diagram illustrating one embodiment of a gating circuit.

FIG. 5 is a diagram illustrating one embodiment of gating circuit 200. The gating circuit 200 includes an OR gate 302, a NAND gate 304, and an INVERTER 306. At one input OR gate 302 receives data mask signal bDM at 308 and at another input OR gate 302 receives write signal bWR at 310. The output of OR gate 302 is electrically coupled at 312 to one input of NAND gate 304. The other input of NAND gate 304 receives the CAS signal CAS at 314. The output of NAND gate 304 is electrically coupled at 318 to the input of INVERTER 306 and the output of INVERTER 306 provides the gated CAS signal GCAS at 320.

CAS signal CAS at 314 includes a timed pulse that pulses from a low voltage level to a high voltage level and back to a low voltage level during a read command and during a write command. The write signal bWR at 310 is an active low signal that is at a high voltage level during a read command and a low voltage level during a write command. The data mask signal bDM at 308 is an active low signal. If data mask signal bDM at 308 is high, then memory cells are not masked and the memory cells can be written with data. If data mask signal bDM at 308 is low, memory cells are masked and the memory cells are not to be written with data.

If write signal bWR at 310 is at a high voltage level, indicating a read command, OR gate 302 provides a high voltage level output at 312 and NAND gate 304 provides the inverse of CAS signal CAS at 318 to the input of INVERTER 306. The gated CAS signal GCAS at 320 and at the output of INVERTER 306 is similar to CAS signal CAS at 314. Also, if data mask signal bDM at 3108 is at a high voltage level, indicating that memory cells are not masked and can be written, OR gate 302 provides a high voltage level output at 312 and NAND gate 304 provides the inverse of CAS signal CAS at 318 to the input of INVERTER 306. The gated CAS signal GCAS at 320 and at the output of INVERTER 306 is similar to CAS signal CAS at 314 and is provided to a timer circuit, such as timer 202 (shown in FIG. 4). If write signal bWR at 310 and data mask signal bDM at 308 are at low voltage levels, OR gate 302 provides a low voltage level output at 312 and NAND gate 304 provides a high voltage level output at 318 to the input of INVERTER 306. The gated CAS signal GCAS at 320 and at the output of INVERTER 306 remains at a low voltage level and the pulse in CAS signal CAS at 314 is blocked by gating circuit 200.

Figure 6:
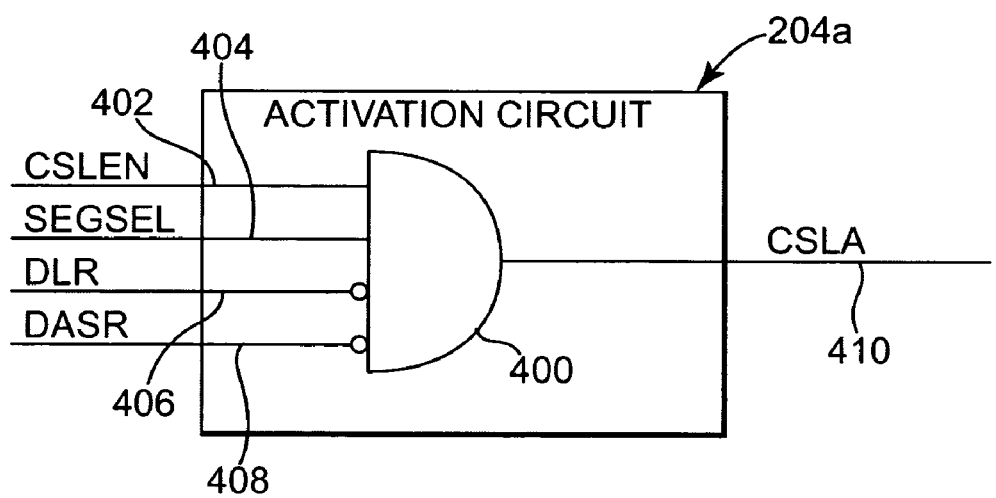
FIG. 6 is a diagram logically illustrating one embodiment of an activation circuit.

FIG. 6 is a diagram logically illustrating one embodiment of an activation circuit 204a. Activation circuit 204a includes AND gate 400 that includes non-inverting inputs 402 and 404 and inverting inputs 406 and 408. Activation circuit 204a receives the column select line enable signal CSLEN at 402 from timer circuit 202 (shown in FIG. 4) and segment select signal SEGSEL at 404. Also, activation circuit 204a receives disable for local redundancy signal DLR at 406 and disable for adjacent segment redundancy signals DASR at 408. Activation circuit 204a provides a columns select line activation signal CSLA at 410.

Segment select signal SEGSEL at 404 is the product of address decoding and indicates whether a column segment is addressed. If the column segment is addressed, the segment select signal SEGSEL at 404 is set to a high voltage level. If a column segment is not addressed, the segment select signal SEGSEL at 404 is set to a low voltage level.

Disable for local redundancy signal DLR at 406 indicates whether a column select line is replaced with a spare column select line in the local column segment. The replaced column select line is suppressed. If the column select line is replaced the disable for local redundancy signal DLR at 406 is at a high voltage level. If a column select line is not replaced the disable for local redundancy signal DLR at 406 is at a low voltage level.

Disable for adjacent segment redundancy signals DASR at 408 indicates whether a column select line is replaced with a spare column select line in an adjacent column segment. The replaced column select line is suppressed. If the column select line is replaced, the disable for adjacent segment redundancy signals DASR at 408 is at a high voltage level. If a column select line is not replaced, the disable for adjacent segment redundancy signals DASR at 408 is at a low voltage level.

Activation circuit 204a receives the column select line enable signal CSLEN at 402 from timer circuit 202 and the activation control signals, including segment select signal SEGSEL at 404, disable for local redundancy signal DLR at 406, and disable for adjacent segment redundancy signal DASR at 408. If segment select signal SEGSEL at 404 is a high voltage level and disable for local redundancy signal DLR at 406 is a low voltage level and disable for adjacent segment redundancy signal DASR at 408 is a low voltage level, activation circuit 204a provides a column select line activation signal CSLA at 410 based on the column select line enable signal CSLEN at 402. If the column select line enable signal CSLEN at 402 includes a pulse, activation circuit 204a provides a pulse in the column select line activation signal CSLA at 410. If the column select line enable signal CSLEN at 402 remains at a low voltage level, activation circuit 204a provides a low voltage level column select line activation signal CSLA at 410 that inhibits activation of the corresponding column select line.

If segment select signal SEGSEL at 404 is a low voltage level or disable for local redundancy signal DLR at 406 is a high voltage level or disable for adjacent segment redundancy signal DASR at 408 is a high voltage level, activation circuit 204a provides a low voltage level column select line activation signal CSLA at 410 that inhibits activation of the corresponding column select line.

In one embodiment, RAM 24 (shown in FIG. 1) includes a gating circuit, similar to gating circuit 200 of FIG. 5, and activation circuits, similar to activation circuit 204a of FIG. 6. RAM 24 disables write commands by preventing activation of column select lines that are masked or replaced, instead of disabling write commands by providing high voltage levels to each of two differential inputs on a sense amplifier. This reduces current consumed by RAM 24 and prevents data retention problems.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A random access memory, comprising:
an array of memory cells;
a first circuit configured to receive an address to address memory cells in the array of memory cells; and
a second circuit configured to obtain control signals including an address strobe signal and a data mask signal and to gate the address strobe signal via the data mask signal to provide a gated address strobe signal and to control activation of a select line signal based on the gated address strobe signal.

2. The random access memory of claim 1, wherein the second circuit is configured to receive control signals including a write signal and to gate the address strobe signal via the data mask signal and the write signal to provide the gated address strobe signal.

3. The random access memory of claim 1, comprising a timer that provides a select line enable signal, wherein the timer receives the gated address strobe signal and provides the select line enable signal in response to the gated address strobe signal.

4. The random access memory of claim 1, wherein the second circuit is configured to obtain an adjacent segment redundancy signal and to control activation of the select line signal based on the obtained adjacent segment redundancy signal.

5. The random access memory of claim 1, wherein the first circuit comprises a column decoder circuit and the second circuit comprises a control circuit.

6. A computer system, comprising:
a processor; and
a random access memory configured to receive row addresses and column addresses and control signals via the processor, the random access memory comprising:
an array of memory cells;
a row decoder configured to receive the row addresses via the processor to address selected memory cells in the array of memory cells;
a column decoder configured to receive the column addresses via the processor to address the selected memory cells in the away of memory cells; and
a control circuit configured to obtain the control signals via the processor and to obtain a column address strobe signal and a data mask signal and to gate the column address strobe signal via the data mask signal to provide a gated column address strobe signal and to selectively activate a column select line signal based on the gated column address strobe signal.

7. The computer system of claim 6, wherein the control circuit is configured to receive a write signal and to gate the column address strobe signal via the data mask signal and the write signal to provide the gated column address strobe signal.

8. The computer system of claim 6, wherein the control circuit is configured to check redundancy of the column addresses and provide an adjacent segment redundancy signal that indicates if the addressed column is to be replaced with a spare column in a different column segment and to selectively activate the column select line signal based on the adjacent segment redundancy signal.

9. The computer system of claim 6, wherein the random access memory is configured as a dynamic random access memory configured to receive dynamic random access memory control signals including a column address strobe signal via the processor.

10. The computer system of claim 6, wherein the random access memory is configured as a pseudo-static random access memory that is configured to receive static random access memory control signals and provide dynamic random access memory control signals based on the static random access memory control signals.

11. A random access memory, comprising:
an array of memory cells;
a first circuit configured to receive addresses to address memory cells in the array of memory cells; and
a second circuit configured to check redundancy of the addresses and provide an adjacent segment redundancy signal that indicates if the addressed memory cells are to be replaced with spare memory cells in a different memory cell segment and to control activation of a select line signal based on to adjacent segment redundancy signal.

12. The random access memory of claim 11, wherein the second circuit is configured to receive control signals including an address strobe signal and gate the address strobe signal using ether control signals to provide a gated address strobe signal and to control activation of the select line signal based on the gated address strobe signal.

13. The random access memory of claim 12, comprising a timer that provides a select line enable signal, wherein the timer receives the gated address strobe signal and provides the select line enable signal in response to the gated address strobe signal.

14. The random access memory of claim 12, wherein the second circuit is configured to receive a data mask signal and a write signal and to gate the address strobe signal based on the data mask signal and the write signal.

15. A random access memory, comprising:
means for receiving an address;
means for addressing memory cells based on the received address;
means for obtaining control signals including an address strobe signal and a data mask signal;
means for gating the address strobe signal via the data mask signal; and
means for controlling activation of a select line signal based on the gated address strobe signal.

16. The random access memory of claim 15, comprising:
means for obtaining an adjacent segment redundancy signal; and means for controlling activation of the select line signal based on the obtained adjacent segment redundancy signal.

17. The random access memory of claim 15, wherein the means for obtaining control signals comprises means for obtaining control signals including a write signal and the means for gating the address strobe signal comprises means for gating the address strobe signal via the data mask signal and the write signal.

18. A random access memory, comprising:
means for receiving an address;
means for addressing memory cells based on the received address;
means for checking redundancy of the address to provide an adjacent segment redundancy signal that indicates if the addressed memory cells are to be replaced with spare memory cells in a different memory cell segment; and
means for controlling activation of a select line signal based on the adjacent segment redundancy signal.

19. The random access memory of claim 18, comprising:
means for receiving control signals including an address strobe signal;
means for gating the address strobe signal using other control signals; and
means for controlling activation of the select line signal based on the gated address strobe signal.

20. A method of controlling access to memory cells in a random access memory, comprising:
receiving an address;
addressing memory cells based on the received address;
obtaining control signals including an address strobe signal and a data mask signal;
gating the address strobe signal via the data mask signal; and
controlling activation of a select line signal based on the gated address strobe signal.

21. The method of claim 20, wherein:
obtaining control signals comprises obtaining control signals including a write signal; and
gating the address strobe signal comprises gating the address strobe signal via the data mask signal and the write signal.

22. The the method of claim 20, comprising:
receiving the gated address strobe signal at a timer; and
providing a select line enable signal in response to the gated address strobe signal.

23. The method of claim 20, comprising:
obtaining an adjacent segment redundancy signal; and
controlling activation of the select line signal based on the obtained adjacent segment redundancy signal.

24. A method of controlling access to memory cells in a computer system, comprising:
receiving a row address and a column address via a processor;
addressing selected memory cells in the array of memory cells using the row address;
addressing selected memory cells in the array of memory cells using the column address;
receiving control signals via the processor:
obtaining a column address strobe signal;
obtaining a data mask signal;
gating the column address strobe signal via the data mask signal to provide a gated column address strobe signal; and
activating a column select line signal based on the gated column address strobe signal.

25. The method of claim 24, wherein receiving control signals comprises receiving a write signal and gating the column address strobe signal comprises gating the column address strobe signal via the data mask signal and the write signal.

26. The method of claim 24, comprising:
checking redundancy of the column address to provide an adjacent segment redundancy signal that indicates if the addressed column is to be replaced with a spare column in a different column segment; and
activating the column select line signal based on the adjacent segment redundancy signal.

27. The method of claim 24, wherein obtaining a column address strobe signal comprises receiving the column address strobe signal via the processor.

28. The method of claim 24, wherein receiving control signals via the processor comprises receiving static random access memory control signals and obtaining a column address strobe signal comprises obtaining the column address strobe signal using the static random access memory control signals.

29. A method of controlling access to memory cells in a random access memory, comprising:
receiving an address;
addressing memory cells based on the received address;
checking redundancy of the address to provide an adjacent segment redundancy signal that indicates if the addressed memory cells are to be replaced with spare memory cells in a different memory cell segment; and
controlling activation of a select line signal based on the adjacent segment redundancy signal.

30. The method of claim 29, comprising:
receiving control signals including an address strobe signal;
gating the address strobe signal using other control signals; and
controlling activation of the select line signal based on the gated address strobe signal.

31. A random access memory, comprising:
an array of memory cells;
a first circuit configured to receive an address to address memory cells in the array of memory cells; and
a second circuit configured to obtain control signals including an address strobe signal, a data mask signal, and a write signal and gate the address strobe signal based on the data mask signal and the write signal to provide a gated address strobe signal and to control activation of a select line signal based on the gated address strobe signal and wherein the second circuit is configured to obtain an adjacent segment redundancy signal and to control activation of the select line signal based on the obtained adjacent segment redundancy signal.

* * * * *